United States Patent [19]
Nadahara et al.

[11] Patent Number: 6,159,303
[45] Date of Patent: Dec. 12, 2000

[54] LIQUID DISPLACEMENT APPARATUS AND LIQUID DISPLACEMENT METHOD

[75] Inventors: Soichi Nadahara; Katsuya Okumura, both of Yokohama, Japan

[73] Assignee: Kabushiki Kaisha Toshiba, Kawasaki, Japan

[21] Appl. No.: 09/105,029

[22] Filed: Jun. 25, 1998

[30] Foreign Application Priority Data

Jun. 27, 1997 [JP] Japan .................................. 9-171699

[51] Int. Cl.⁷ .................................. B08B 3/04; B08B 7/04

[52] U.S. Cl. .................................. 134/10; 134/24; 134/34; 134/182; 134/186; 134/902

[58] Field of Search .................................. 134/13, 10, 24, 134/34, 155, 182, 186, 902

[56] References Cited

U.S. PATENT DOCUMENTS

| | | | |
|---|---|---|---|
| 5,673,713 | 10/1997 | Han | 134/182 X |
| 5,743,280 | 4/1998 | Han | 134/186 X |
| 5,879,464 | 3/1999 | Denzler et al. | 134/2 |

*Primary Examiner*—Frankie L. Stinson
*Assistant Examiner*—Saud Chaudhry
*Attorney, Agent, or Firm*—Finnegan, Henderson, Farabow, Garrett & Dunner, L.L.P.

[57] ABSTRACT

A liquid displacement apparatus comprises a processing tank for placing a target object in its inside, a supply unit for supplying at least pure water into the processing tank from a lower part thereof, in which the pure water is drained by overflow from an upper part of the processing tank, and a drain unit disposed in the upper part of the processing tank for partially increasing a flow rate of the pure water in the processing tank.

19 Claims, 5 Drawing Sheets

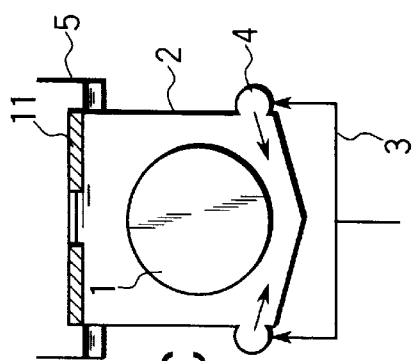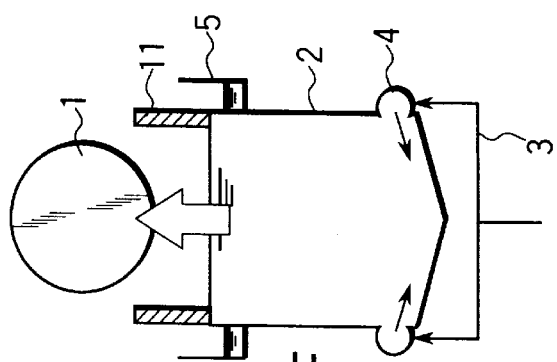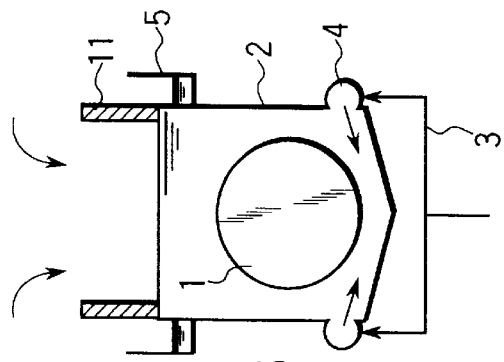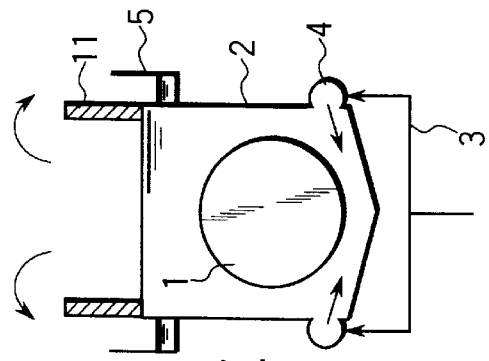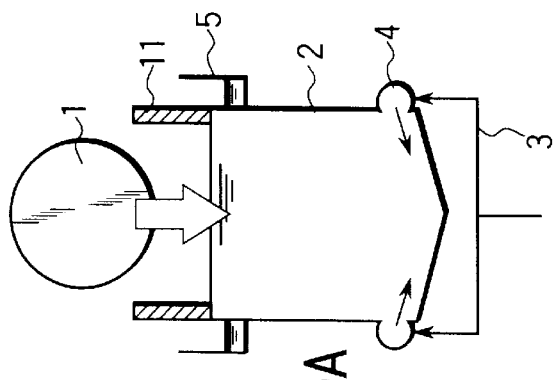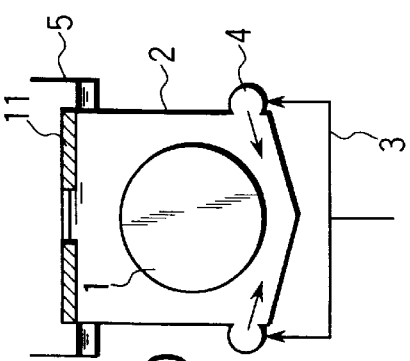

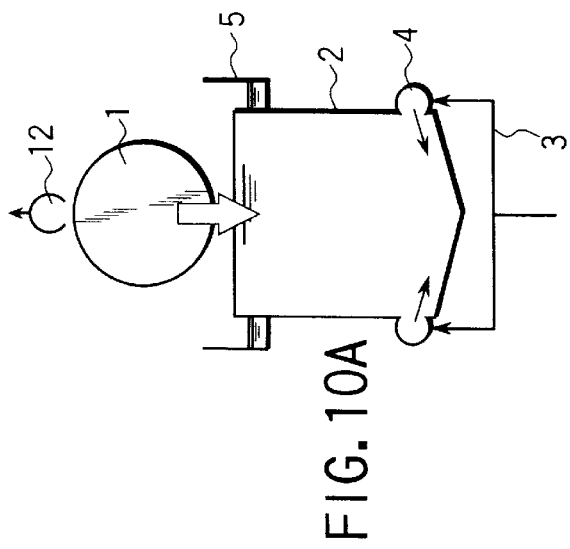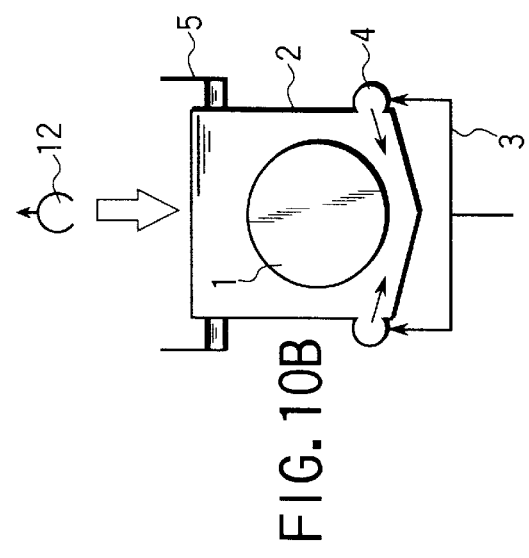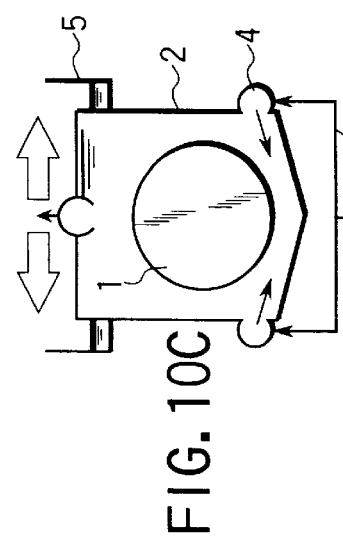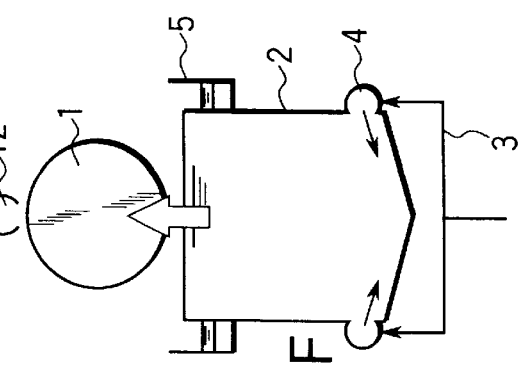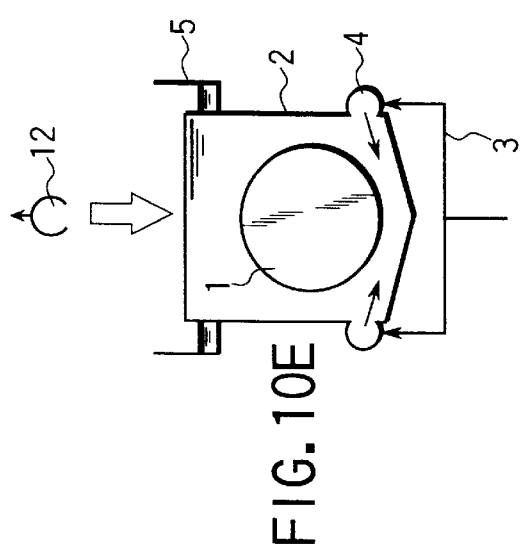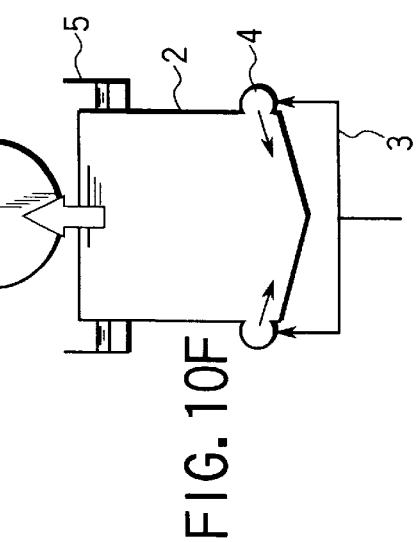

LIQUID DISPLACEMENT APPARATUS AND LIQUID DISPLACEMENT METHOD

BACKGROUND OF THE INVENTION

The present invention relates to a liquid displacement apparatus and a liquid displacement method.

FIG. 1 is an explanatory diagram showing a constitution of a flushing apparatus of direct displacement type (or full-flow type). FIG. 1 shows a semiconductor wafer 1, a processing tank 2, a supply line 3 for supplying liquid (pure water or chemical solution) to the processing tank 2 through a supply nozzle 4, and a drain 5. In this flushing apparatus, when flushing semiconductor wafers, various liquids are displaced while always overflowing pure water except for a certain standing process time.

The liquids are displaced as follows.

Pure water and liquid are supplied into, for example, a mixing valve (not shown) connected to the supply line 3.

Consumption of pure water at this time is huge, for example, supposing one-hour flushing process in the condition of pure water of 20 liters/min, one processing tank requires more than 1 m$^3$ of pure water. Huge consumption of pure water means huge drainage, and it has significant effects on the wastewater treating system of the plant, and problems are serious. In addition, it is predicted that 300 mm wafers be used in next-generation devices, and the required capacity of processing tank is about two times larger, and problems are more serious about consumption of pure water and treatment of wastewater.

In a conventional apparatus constitution, first, to supply pure water, a pure water supply valve is opened to supply pure water, and then a liquid supply valve is opened to supply liquid. When supply of liquid is over, the liquid supply valve is closed to stop supply of liquid, while pure water is supplied continuously until the liquid concentration becomes lower than a specific standard in order to drain the residual liquid (this is called "rinse process"). The rinse time required for displacing liquid with pure water is considerably long for the entire flushing process time, and more than half of the entire flushing time is occupied by the rinse time for drainage of liquid by pure water, and this rinse process is bottleneck for shortening the time and simplifying the entire flushing process. This rinse time is so long because, in stationary convection, multiple tiny whirls are formed around the semiconductor wafer 1, and the displacement efficiency of liquid and pure water is lowered by the whirls.

It is thus a problem of the conventional apparatus that, as the consumption of pure water is enormous, it takes a longer time in the rinse process for displacing the liquid with pure water.

BRIEF SUMMARY OF THE INVENTION

It is an object of the present invention to provide a liquid displacement apparatus and a liquid displacement method capable of saving the consumption of pure water and shortening the liquid displacement time.

A first aspect of the present invention comprises a processing tank for placing a target object in its inside; and a supply unit for supplying at least pure water into the processing tank from a lower part thereof, wherein the pure water is drained by overflow from an upper part of the processing tank and a flow rate of the pure water in the processing tank when draining the pure water is partially increased.

According to the first aspect of the present invention, by partially increasing the flow rate of the pure water (or liquid) in the processing tank, the balance of stationary convection is broken and stagnant flow of liquid is prevented, so that the displacement efficiency of liquid by pure water can be enhanced. Therefore, the consumption of pure water is saved, and the liquid displacement time can be shortened.

Preferred embodiments of the first aspect of the present invention are as follows.

(1) The supply unit includes a unit for supplying a liquid.

(2) In (1), the drain unit includes a unit for increasing the flow rate of the pure water in the processing tank when draining the pure water displacing the liquid to outside of the processing tank.

(3) The drain unit includes a unit for decreasing the area of the drainage region.

(4) In (3), the unit for decreasing the area of the drainage region includes a shielding unit.

(5) In (4), the shielding unit has an openable or detachable structure.

(6) In (4), the shielding unit is rockable.

(7) The drain unit includes a unit for forcibly draining the pure water, which displaces the liquid, to outside of the processing tank. (8) In (7), the unit for forcibly draining the pure water includes a drain nozzle.

(9) In (8), the drain nozzle has a movable structure.

(10) In (8), the drain nozzle is rockable.

In this case, according to (6) or (10), since the balance of the stationary flow is further broken, the liquid displacement efficiency can be further enhanced, and the consumption of pure water is saved and the liquid displacement time can be shortened furthermore.

A second aspect of the present invention comprises: a processing tank for placing a target object in its inside, and a supply unit for supplying at least pure water into the processing tank from a lower part thereof, wherein the pure water drained by overflow from an upper part of the processing tank and a drainage flow rate of the pure water is changed in a course of time.

According to the second aspect of the present invention, by varying the flow rate in the time course, same as in the first aspect, the balance of stationary convection is broken and stagnant flow of liquid can be prevented, and therefore the displacement efficiency of liquid by pure water is enhanced, consumption of pure water is saved, and the liquid displacement time is shortened.

The present invention is applied not only to the apparatus of direct displacement type (or full-flow type) for flushing with the liquid and displacing the liquid with pure water (rinse process) in the same processing tank, but also to the apparatus of overflow type displacement tank (rinse tank) for flushing with the liquid and displacing the liquid with pure water in different tanks.

Thus, according to the present invention, by breaking the balance of the stationary convection, stagnant flow of liquid is prevented and liquid displacement efficiency is enhanced, and therefore consumption of pure water is saved and liquid displacement time can be shortened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A to FIG. 9F are diagrams showing the procedure of replacing semiconductor wafers in the apparatus in FIG. 2; and FIG. 10A to FIG. 10F are diagrams showing the procedure of replacing semiconductor wafers in the apparatus in FIG. 5.

DETAILED DESCRIPTION OF THE INVENTION

Figure 1:
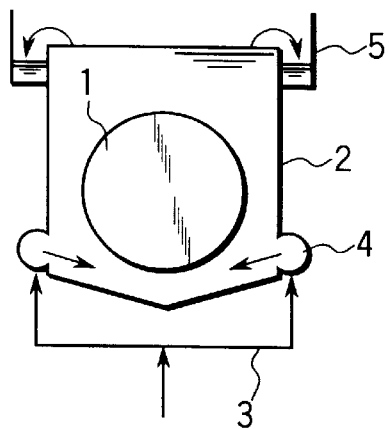
FIG. 1 is an explanatory diagram showing a prior art.

Referring now to the drawings, preferred embodiments of the present invention are described in detail below.

A first embodiment of the present invention will be described.

Figure 2:
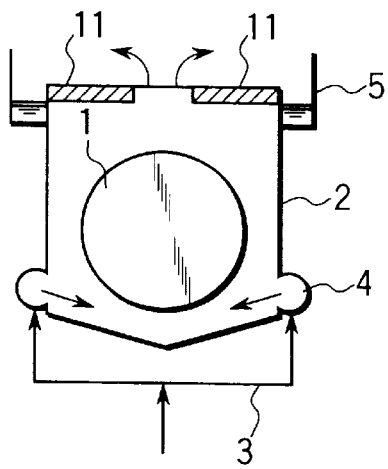
FIG. 2 is a schematic diagram showing a liquid displacement apparatus according to a first embodiment of the present invention.

FIG. 2 is an explanatory diagram showing a constitution of a flushing apparatus of direct displacement type (or full-flow type). FIG. 2 shows a semiconductor wafer 1 as target object, a processing tank 2 filled with liquid (pure water and/or chemical solution), a supply line 3 for supplying liquid to the processing tank 2 through a supply nozzle 4, and a drain 5, and the fundamental constitution of them is same as in the conventional apparatus.

In such constitution in FIG. 2, a shielding plate 11 is provided around the upper part of the processing tank 2. When the shielding plate 11 is thus provided around the upper part of the processing tank 2, the liquid is drained from the central opening.

Figure 3:
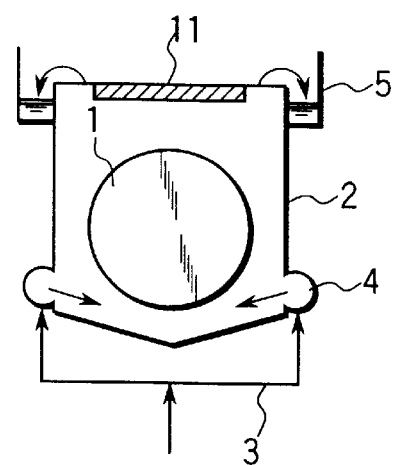
FIG. 3 is a diagram showing a modification of the liquid displacement apparatus according to the first embodiment of the present invention.

FIG. 3 is a modification of FIG. 2, and the shielding plate 11 is provided in the center of the upper part of the processing tank 2, so that the liquid is drained from the peripheral opening.

As described above, in the first embodiment, by partially decreasing the area of drainage region by disposing the shielding plate 11 on the processing tank 2, the flow rate is partially increased when draining the liquid.

In the flushing apparatus, same as in the conventional apparatus, pure water is always supplied into the processing tank 2 from the supply line 3 through the supply nozzle 4, and by supplying desired liquid into the processing tank 2 for a specific time through the supply nozzle 4, the flush processing of the semiconductor wafer is performed. When supply of liquid is stopped, the pure water is mixed with the liquid to displace while repeating convection in the processing tank 2, and is drain from the upper part of the processing tank 2. At the time of draining, in the conventional apparatus, since the displacement of liquid was promoted from the outer periphery of the wafer where the flow resistance is smaller, it took a longer time to displace in the central area of the wafer.

In this embodiment, by disposing the shielding plate 11, as compared with the drainage speed without shielding plate 11, the partial drainage speed in the drainage region is raised, and the balance of the stationary convection occurring in the prior art is broken (that is, whirls formed around the semiconductor wafer 1 are suppressed), and therefore the liquid displacement efficiency with pure water is enhanced and the rinse time is shortened.

Incidentally, by rocking the shielding plate 11, the drainage speed can be partially varied, and the balance of the stationary convection can be further broken, so that the displacement efficiency with pure water may be enhanced still more.

Figure 4:
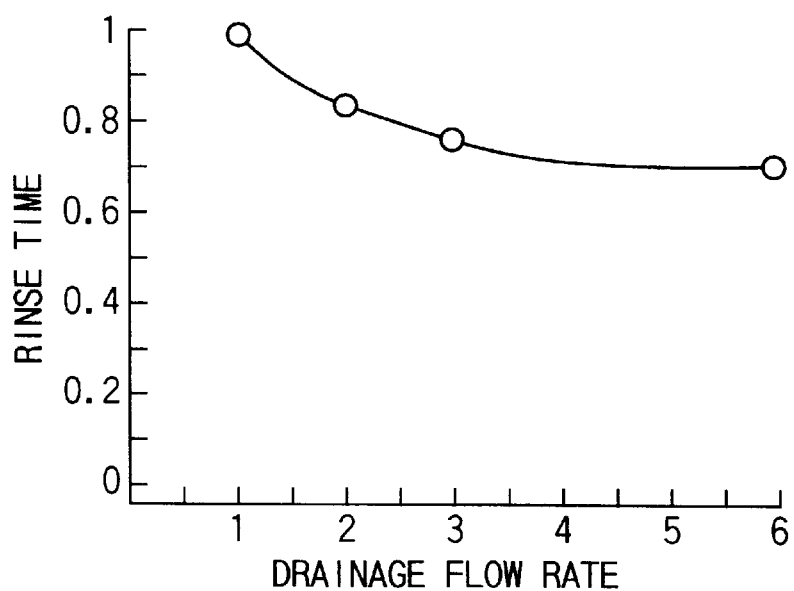
FIG. 4 is a diagram showing the shortening effect of rinse time obtained in the present invention.

FIG. 4 shows the relation between the ratio of the drainage flow rate without shielding plate 11 to the drainage flow rate with the shielding plate 11 and the rinse time (the flow rate can be varied by the area of the shielding plate). As clear from FIG. 4, by installing the shielding plate, the rinse time can be shortened.

A second embodiment of the present invention will be described.

Figure 5:
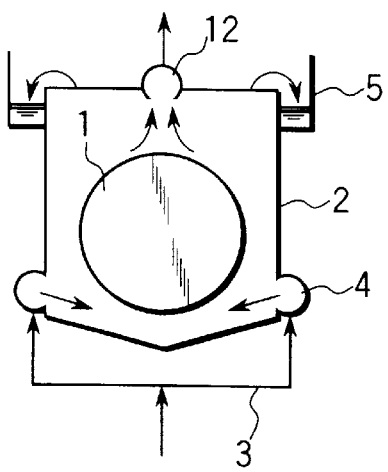
FIG. 5 is a schematic diagram showing a liquid displacement apparatus according to a second embodiment of the present invention.

FIG. 5 is an explanatory diagram showing a constitution of a flushing apparatus of direct displacement type (or full-flow type) according to the second embodiment. The fundamental constitution is same as in the first embodiment, and same reference numerals are attached to the substantially same or corresponding constituent members as the constituent members shown in FIG. 2, and description will be omitted.

Figure 6:
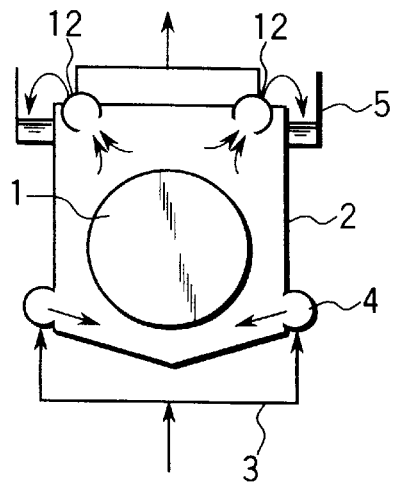
FIG. 6 is a diagram showing a modification of the liquid displacement apparatus according to the second embodiment of the present invention.

In such constitution in FIG. 5, a drain nozzle 12 is provided in the center of the upper part of the processing tank 2. FIG. 6 is a modification of FIG. 5, and the drain nozzle 12 is provided in the periphery of the upper part of the processing tank 2.

In the second embodiment, thus, by disposing the drain nozzle 12 in the upper part of the processing tank 2, and draining the liquid by force through a pump (not shown) connected to the drain nozzle 12, the partial flow rate when draining the liquid is increased.

The fundamental operation is same as in the first embodiment, and by disposing the drain nozzle 12, the partial drainage flow rate is raised as compared with the drainage flow rate without drain nozzle 12, and the balance of stationary convection is broken, and therefore the displacement efficiency of liquid by pure water is enhanced, and the rinse process time can be shortened.

Moreover, same as in the first embodiment, by rocking the drain nozzle 12, the partial drainage flow rate can be changed, and the balance of the stationary convection can be further broken, so that the displacement efficiency by pure water can be enhanced still more.

Also by changing the drainage flow rate form the drain nozzle 12 in the time course (for example, changing the suction capacity of the pump connected to the drain nozzle 12 periodically), the balance of the stationary convection can be broken, and the displacement efficiency can be further enhanced.

Figure 7:
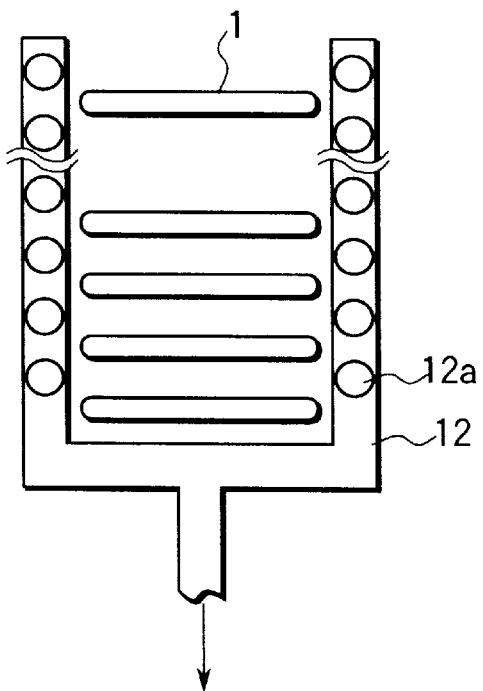
FIG. 7 is a block diagram of a drain nozzle in the second embodiment of the present invention.

FIG. 7 is a block diagram of the drain nozzle 12. By disposing plural holes 12a formed in the drain nozzle 12 between wafers 1, the flow rate between the wafers can be enhanced. As a result, stagnant flow of liquid between wafers can be prevented, and the displacement efficiency may be enhanced furthermore.

A third embodiment of the present invention is described.

Figure 8:
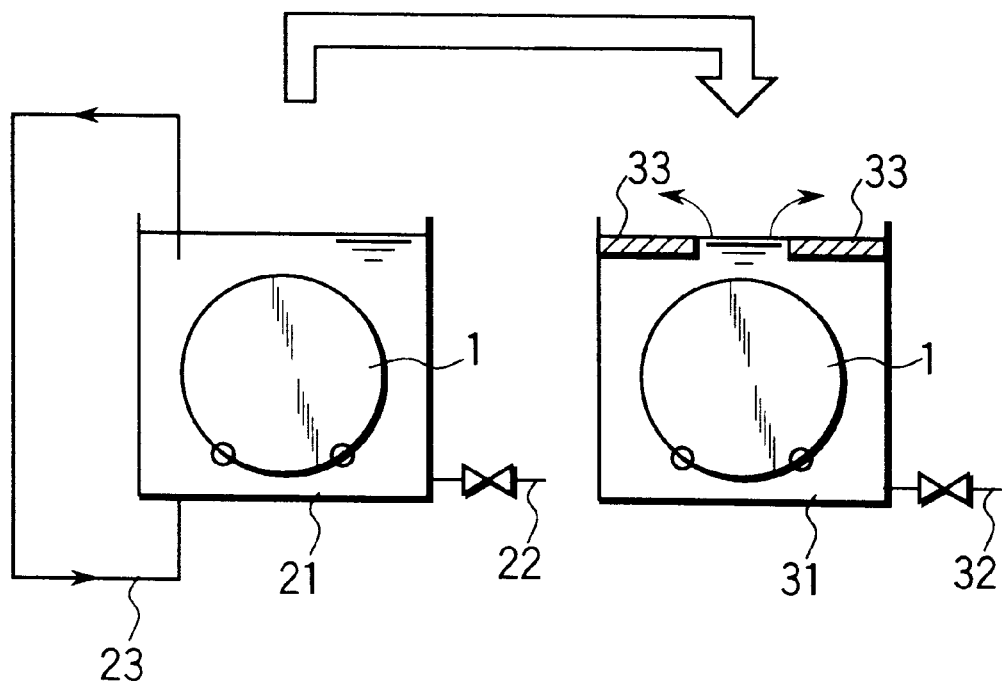
FIG. 8 is a schematic diagram showing a liquid displacement apparatus according to a third embodiment of the present invention.

FIG. 8 is an explanatory diagram showing a constitution of a flushing apparatus of the third embodiment. In the first and second embodiments, the present invention is applied to the flushing apparatus of direct displacement type (or full-flow type), whereas in the third embodiment, the present invention is applied to the apparatus separated into the flushing tank and rinse tank.

FIG. 8 shows a flushing tank 21 and a supply line 22 for supplying liquid, and the liquid in the flushing tank 21 is circulating in a circulation line 23. The semiconductor wafer 1 being flushed in the flushing tank 21 is transferred into an overflow rinse tank 31 to be rinsed. In the overflow rinse tank 31, pure water is supplied from the supply line 32, and the liquid is displaced with this pure water, and is drained from the opening in the upper part of the overflow rinse tank 31.

In this embodiment, same as in the first embodiment, a shielding plate 33 is provided in the upper part of the overflow rinse tank 31, and the partial flow rate is increased when draining the liquid, and by breaking the balance of the stationary convection, the liquid displacement efficiency with pure water is enhanced, and the rinse process time is shortened.

In this embodiment, also, a drain nozzle may be also disposed the same as in the second embodiment. Still more, the shielding plate or the drain nozzle may be rocked, or the drain flow rate from the drain nozzle may be varied in the time course.

In the foregoing embodiments, the upper part of the processing tank 2 requires a structure capable of loading and unloading the semiconductor wafer 1, or a structure for keeping the opening so that the semiconductor wafer 1 can be loaded or unloaded.

In the first and second embodiments, examples of procedure of exchanging semiconductor wafers are described respectively by referring to FIG. 9A to FIG. 9F and FIG. 10A to FIG. 10F.

First, the replacing procedure of the semiconductor wafer 1 in the apparatus in the first embodiment will be described while referring to FIG. 9A to FIG. 9F.

By opening the shielding plate 11, the semiconductor wafer 1 is conveyed into the processing tank 2 (FIG. 9A). When conveying of the semiconductor wafer 1 is over, the shielding plate 11 is closed in the arrow direction (FIG. 9B). Meanwhile, since the partial flow rate change (control) by the shielding plate 11 is effective in the rinse process, it may be kept open in the flushing process, and may be closed when necessary in the rinse process. After closing the shielding plate 11, the flushing process is started (FIG. 9C), and pure water is supplied until the end of the rinse process (FIG. 9D).

When the flushing process is completed, the shielding plate 11 is opened in the arrow direction to be ready for taking out the semiconductor wafer 1 (FIG. 9E). Finally, the semiconductor wafer 1 is conveyed to outside of the processing tank 2 through the opening.

The replacing procedure of the semiconductor wafer 1 in the apparatus in the second embodiment will be described while referring to FIG. 10A to FIG. 10F.

A conveying route for the semiconductor wafer 1 is secured by moving the drain nozzle 12 to the upper part of the processing tank 2, the semiconductor wafer 1 is conveyed into the inside of the processing tank 2 (FIG. 10A). When conveying of the semiconductor wafer 1 is competed, the drain nozzle 12 is moved to the upper part of the processing tank 2, and is returned to specified position (FIG. 10B). Meanwhile, since the partial flow rate change (control) by the drain nozzle 12 is effective in the rinse process, it may be kept open in the flushing process, and may be closed when necessary in the rinse process. After closing the drain nozzle 12, the flushing process is started (FIG. 10C), and pure water is supplied until the end of the rinse process (FIG. 10D). In the entire procedure of the flushing process, as shown in the second embodiment, the drain nozzle 12 may be rocked as required.

When the flushing process is completely over, the drain nozzle 12 is moved again to the upper part to be ready for taking out the semiconductor wafer 1 (FIG. 10E). Finally, the semiconductor wafer 1 is conveyed to outside of the processing tank 2 from the upper part.

The preferred embodiments of the present invention are described so far, but it must be noted that the present invention is not limited to the illustrated embodiments alone, but may be changed and modified within the true spirit and scope thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A liquid displacement apparatus, comprising:
   a processing tank in which a target object is placed therein;
   a supply unit which supplies at least pure water into said processing tank from a lower lateral face thereof in a direction along a bottom surface thereof; and
   a shielding plate which is disposed on the upper part of said processing tank to partially increase a flow rate of pure water in said processing tank.

2. A liquid displacement apparatus according to claim 1, wherein said supply unit further supplies a liquid.

3. A liquid displacement apparatus according to claim 1, wherein said shielding plate has an openable or detachable structure.

4. A liquid displacement apparatus according to claim 1, wherein said shielding plate is rockable.

5. A liquid apparatus according to claim 1, wherein said liquid displacement apparatus is operated at room temperature.

6. A liquid displacement apparatus according to claim 1, wherein said liquid displacement apparatus is used in a rinse step.

7. A liquid displacement apparatus according to claim 1, wherein said shielding plate is arranged parallel to a surface of the pure water.

8. A liquid displacement apparatus, comprising:
   a processing tank in which a target object is placed therein;
   a supply unit which supplies at least pure water into said processing tank from a lower lateral face thereof in a direction along a bottom surface thereof; and a drain unit disposed on the upper part of said processing tank to change a drainage flow rate of pure water in a course of time.

9. A liquid displacement apparatus, comprising:

a processing tank in which a target object is placed therein;

a supply unit which supplies at least pure water into said processing tank from a lower lateral face thereof in a direction along a bottom surface thereof; and a drain unit which is disposed on the upper part of said processing tank and forcibly drains the pure water, which displaces the liquid, to outside of said processing tank.

10. A liquid displacement apparatus according to claim 9, wherein said drain unit includes a drain nozzle.

11. A liquid displacement apparatus according to claim 9, wherein said drain unit has a movable structure.

12. A liquid displacement apparatus according to claim 9, wherein said drain unit is rockable.

13. A liquid displacement apparatus according to claim 9, wherein said liquid displacement apparatus is operated at room temperature.

14. A liquid displacement apparatus according to claim 9, wherein said liquid displacement apparatus is used in a rinse step.

15. A liquid displacement apparatus according to claim 9, wherein the drain unit has at least two nozzles and said at least two nozzles are arranged parallel to a surface of the pure water.

16. A liquid displacement apparatus, comprising:

a process tank in which a target object is placed therein;

a supply unit which supplies at least pure water into said processing tank from a lower part thereof in a direction along a bottom surface thereof; and a shielding plate which is disposed on the upper part of said processing tank to partially increase a flow rate of pure water in said processing tank, wherein said shielding plate has one of an openable and detachable structure.

17. A liquid displacement apparatus, comprising:

a process tank in which a target object is placed therein;

a supply unit which supplies at least pure water into said processing tank from a lower part thereof in a direction along a bottom surface thereof; and a shielding plate which is disposed on the upper part of said processing tank to partially increase a flow rate of pure water in said processing tank, wherein said shielding plate is rockable.

18. A liquid displacement apparatus, comprising:

a process tank in which a target object is placed therein;

a supply unit which supplies at least pure water into said processing tank from a lower part thereof in a direction along a bottom surface thereof; and a shielding plate which is disposed on the upper part of said processing tank to partially increase a flow rate of pure water in said processing tank, wherein said shielding plate is arranged parallel to a surface of the pure water.

19. A liquid displacement method, comprising the steps of:

supplying at least pure water from a lower lateral face of a processing tank, in which a target object is placed, in a direction along a bottom surface thereof;

draining the pure water by overflow from an upper part of said processing tank; and changing a flow rate in a time course when draining the pure water in said processing tank to outside of said processing tank.

* * * * *